United States Patent [19]
Jang

[11] Patent Number: 6,093,593
[45] Date of Patent: Jul. 25, 2000

[54] METHOD OF FORMING A GATE WHICH PROVIDES A REDUCED CORNER RECESS IN ADJACENT SHALLOW TRENCH ISOLATION

[75] Inventor: Syun-Ming Jang, Hsin-Chu, Taiwan

[73] Assignee: Taiwan Semiconductor Manufacturing Company, Hsin-Chu, Taiwan

[21] Appl. No.: 09/342,043

[22] Filed: Jun. 28, 1999

[51] Int. Cl.[7] ............................................... H01L 21/8238
[52] U.S. Cl. ........................ 438/221; 438/296; 438/424; 438/789; 438/790

[56] References Cited

U.S. PATENT DOCUMENTS

| | | | |
|---|---|---|---|
| 4,635,347 | 1/1987 | Lien et al. | 29/591 |
| 5,563,104 | 10/1996 | Jang et al. | 437/235 |
| 5,605,853 | 2/1997 | Yoo et al. | 437/43 |
| 5,728,621 | 3/1998 | Zheng et al. | 438/427 |
| 5,731,241 | 3/1998 | Jang et al. | 438/424 |
| 5,747,373 | 5/1998 | Yu | 438/305 |
| 5,804,498 | 9/1998 | Jang et al. | 438/624 |
| 5,872,045 | 2/1999 | Lou et al. | 438/432 |
| 5,874,343 | 2/1999 | Fulford, Jr. et al. | 438/305 |

*Primary Examiner*—Long Pham
*Attorney, Agent, or Firm*—George O. Saile; Stephen B. Ackerman; William J. Stoffel

[57] ABSTRACT

The present invention provides a method for forming a gate which provides a reduced recess in an adjacent shallow trench isolation. The process begins by forming a shallow trench isolation on a semiconductor substrate having a cell area and an I/O area. The cell area is separated from the I/O area by the shallow trench isolation. A gate is formed on the cell area of the semiconductor substrate adjacent to the shallow trench isolation. Impurity ions are implanted into the semiconductor substrate adjacent to the gate to form source and drain regions. In a key step, a resist protect oxide layer having a greater porosity than the oxide of the shallow trench isolation, is deposited over the semiconductor substrate, the gate, and the shallow trench isolation. The resist protect oxide layer is patterned to form a resist protect oxide mask over the I/O area; thereby exposing the cell area. Because the resist protect oxide has a much higher etch rate than the oxide of the shallow trench isolation very little corner recessing takes place on the shallow trench isolation. Silicide regions are formed on the source and drain regions. Semiconductor fabrication continues using conventional process to form dielectric layers, contacts and interconnections.

11 Claims, 2 Drawing Sheets

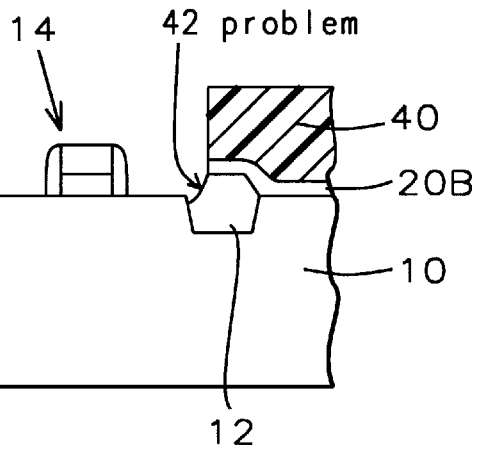
FIG. 1 - Prior Art
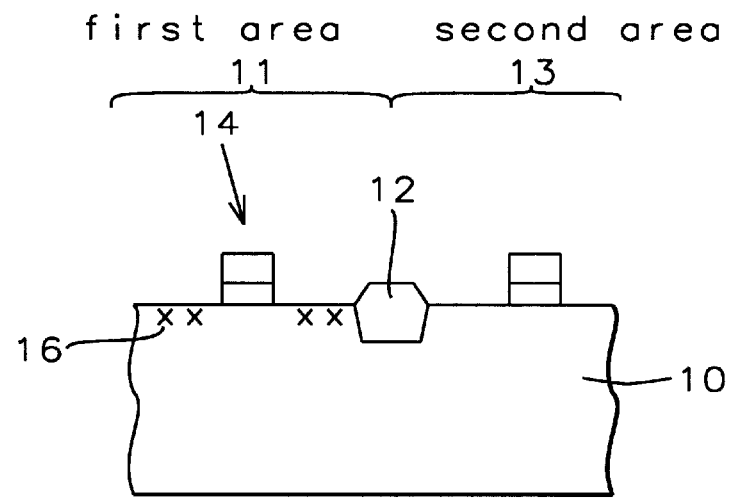
FIG. 2
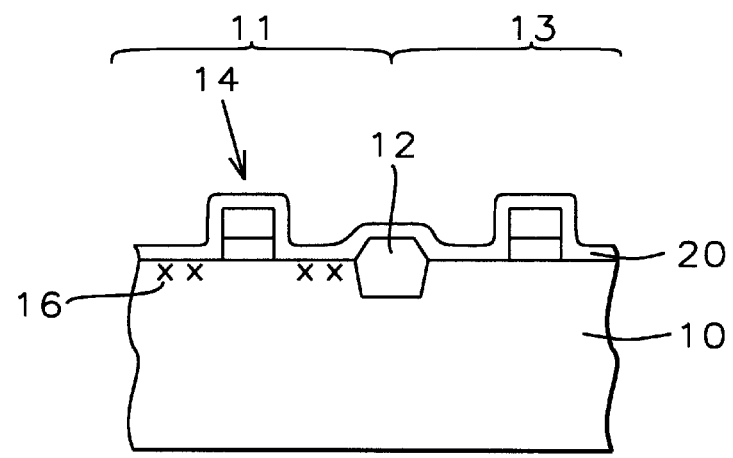
FIG. 3

METHOD OF FORMING A GATE WHICH PROVIDES A REDUCED CORNER RECESS IN ADJACENT SHALLOW TRENCH ISOLATION

BACKGROUND OF THE INVENTION

1) Field of the Invention

This invention relates generally to fabrication of semiconductor devices and more particularly to a method for forming a gate which provides a reduced corner recess in the adjacent shallow trench isolation.

2) Description of the Prior Art

Shallow trench isolations (STI) are widely used in semiconductors manufacturing to provide isolation of active areas on a substrate. However, STI's are susceptible to a problem known as the corner recess problem. Device processing requires wet and/or dry etch steps after the STI has undergone chemical mechanical polishing (CMP) to its final size. These etch steps inevitably etch away part of the STI causing corners of the STI to be recessed. Recessed corners can trap polysilicon and nitride residues during subsequent removal steps, such as gate etching and spacer etching. They can also cause junction leakage associated with salicide formation.

The importance of overcoming the various deficiencies noted above is evidenced by the extensive technological development directed to the subject, as documented by the relevant patent and technical literature. The closest and apparently more relevant technical developments in the patent literature can be gleaned by considering the following patents.

U.S. Pat. No. 4,635,347 (Lien et al.) shows a self-aligned $TiS_x$, gate and contact forming process.

U.S. Pat. No. 5,731,241 (Jang et al.) discloses a O3-TEOS sacrificial layer over a STI.

U.S. Pat. No. 5,563,104 (Jang et al.) and U.S. Pat. No. 5,804,498 (Jang et al.) disclose O3-TEOS deposition processes with reduced sensitivity to the composition of underlying layers.

U.S. Pat. No. 5,605,853 (Yoo) shows a $TiS_x$, process without a RPO layer.

SUMMARY OF THE INVENTION

It is an object of the present invention to provide a method for forming a gate which provides a reduced corner recess in an adjacent shallow trench isolation.

It is another object of the present invention to provide a method forming a resist protect oxide with high etch selectivity to shallow trench isolations formed using HDPCVD or high temperature annealed TEOS-$O_3$ oxide.

It is yet another object of the present invention to provide a method for forming a resist protect oxide layer according to the prior objectives that also has a low surface selectivity.

To accomplish the above objectives, the present invention provides a method for forming a gate which provides a reduced recess in an adjacent shallow trench isolation. The process begins by forming a shallow trench isolation on a semiconductor substrate having a cell area and an I/O area. A gate is formed on the semiconductor substrate in the cell area, adjacent to the shallow trench isolation. Impurity ions are implanted into the semiconductor substrate to form source and drain regions. In a key step, a resist protect oxide layer having a greater porosity than the oxide of the shallow trench isolation, is deposited over the semiconductor substrate, the gate, and the shallow trench isolation. The resist protect oxide layer is patterned to form a resist protect oxide mask; thereby exposing the cell area, including the source and drain regions. Because the resist protect oxide has a much higher etch rate than the oxide of the shallow trench isolation very little corner recessing takes place on the shallow trench isolation. Silicide regions are formed on the source and drain regions. Semiconductor fabrication continues using conventional process to form dielectric layers, contacts and interconnections.

The present invention provides considerable improvement over the prior art. A major part of the invention was the discovery and recognition of the problem. The present invention to provides a method for forming a gate which provides a reduced corner recess in an adjacent shallow trench isolation. Because of the etch selectivity of the resist protect oxide layer over the shallow trench isolation, the resist protect oxide layer can be completely removed from over the source and drain regions while the shallow trench isolation suffers much less corner recessing than in conventional processes. Because there is a much less recessed corner on the shallow trench isolation, trapped polysilicon and nitride residues are reduced. Also, junction leakage associated with salicide formation is reduced.

Another advantage of the present invention is that the resist protect oxide layer formed according to the present invention has a lower surface selectivity than conventional oxide layers.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIG. 1 shows a prior art device with a corner recess in the shallow trench isolation due to etching.

FIGS. 2, 3, 4, 5 & 6 illustrate sequential sectional views of a process for forming a gate which provides a reduced recess in an adjacent shallow trench isolation.

DETAILED DESCRIPTION OF THE INVENTION

Figure 4:
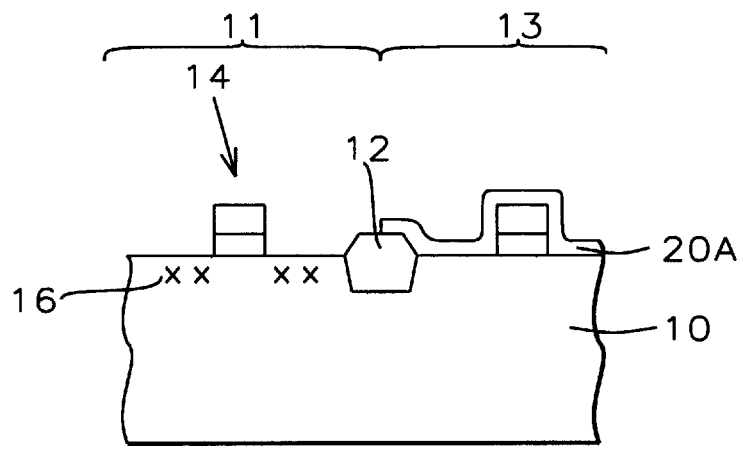

The present invention will be described in detail with reference to the accompanying drawings. The present invention provides a method for forming a gate which provides a reduced recess in an adjacent shallow trench isolation.

As shown in FIG. 1, in the inventors' previous process, the etching steps, especially resist protect oxide etch, can cause corner recesses (42) in the shallow trench isolation (12).

Referring to FIG. 2, the present invention begins by forming a shallow trench isolation (12) on a semiconductor substrate (10) as is known in the art. The shallow trench isolation is preferably composed of a high quality oxide formed using an HDPCVD process or a high temperature annealed $O_3$-TEOS process. The substrate has a cell area (11) and an I/O area (13) separated by the shallow trench isolation (12).

Still referring to FIG. 2, a gate (14) is formed on the semiconductor substrate (10) in the cell area (11). The gate can comprise a gate oxide or other barrier layer formed on the semiconductor substrate. Preferably the gate electrode is composed of polysilicon.

As shown in FIG. 2, impurity ions are implanted into the semiconductor substrate adjacent to the gate to form source and drain regions (16). Preferably, the source and drain regions are formed by implanting B ions or As ion. B ions are implanted at an energy of between about 4.5 KeV and 5.5 KeV and at a dose of between about 3E15 atm/cm$^2$ and 4E15 atm/cm$^2$. As ions are implanted at an energy of between about 35 KeV and 45 KeV and at a dose of between about 5E15 atm/cm$^2$ and 6E15 atm/cm$^2$.

Referring to FIG. 3, a resist protect oxide layer (20) is deposited on the semiconductor substrate (10), the shallow trench isolation (12), and the gate (14). The resist protect oxide layer (20) is preferably deposited using TEOS-O$_3$ having a ratio of TEOS/O$_3$ of between about 4 and 6. The deposition temperature is preferably between about 350° C. and 400° C., and the deposition pressure is preferably between about 50 torr and 70 torr. The resist protect oxide layer (20) preferably has a thickness of between about 100 Angstroms and 400 Angstroms.

It is important to understand that the O$_3$/TEOS process of the invention differs from a conventional O$_3$/TEOS process in three areas: (1) lower temperature, (2) lower pressure, and (3) lower O$_3$:TEOS ratio. The resist protect oxide layers (20) were formed according to present invention and using a PE oxide with and without rapid thermal anneal at 1050° C. for 15 seconds. The wet etch rate ratios (WERR: normalized to the WER of thermal oxide, HDP≈1.1) were measured and are presented in table 1.

TABLE 1

|  | RTA | no RTA |
|---|---|---|
| low O$_3$ oxide (invention) | 6.1 | 12 |
| PE oxide | 2.1 | 3.1 |

A key advantage of the present invention is that the resist protect oxide layer (20) has a greater etch rate than the shallow trench isolation (12). The greater etch rate is due to the higher porosity of the resist protect oxide (20) as compared to the oxide in the shallow trench isolation (12). Preferably, the ratio of the etch rate of the resist protect oxide over the etch rate of the shallow trench isolation is between about 8 and 10. Also, the higher porosity resist protect oxide has a lower surface selectivity than does a lower porosity oxide. The prior art teaches a lower porosity (higher quality and lower etch rate) resist protect oxide (e.g. PE SiH$_4$ oxide).

Referring to FIG. 4, the resist protect oxide layer (20) is patterned to form a resist protect oxide mask (20A) over the I/O area (13), thereby exposing the cell area (11). The resist protect oxide can be patterned using conventional photolithography followed by an anisotropic etch. The etch is preferably performed using a buffered oxide etch (NH$_4$F plus an aqueous solution of HF: e.g. HF in H$_2$O) with a concentration of between about 100 and 200. Because of the high etch selectivity of the resist protect oxide (20) over the oxide of the shallow trench isolation (12), the resist protect oxide (20) over the I/O area (13) can be completely removed, while the corners of the shallow trench isolation (12) are etched much less than in conventional processes. Thus, the corner recess problem is significantly reduced.

Figure 5:
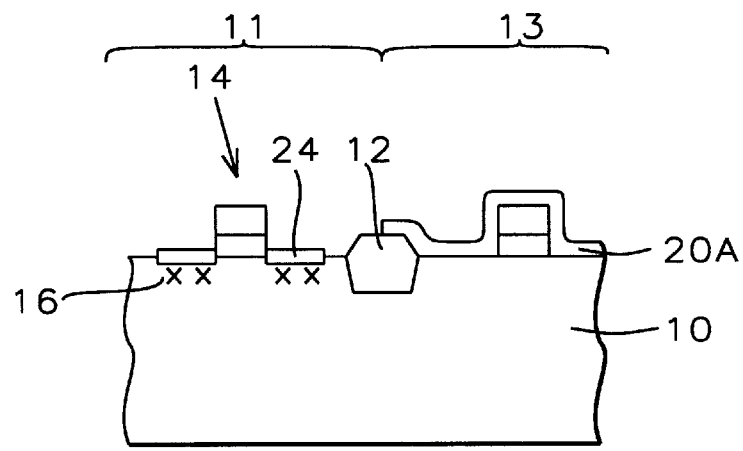

Referring to FIG. 5, silicide regions (24) are formed on the source and drain regions (16) using a conventional salicide process. The silicide can be comprised of TiSi$_x$, CoSi$_x$, or NiSi$_x$. An advantage of the present invention is that the reduced corner recess allows for a thicker silicide region.

Figure 6:
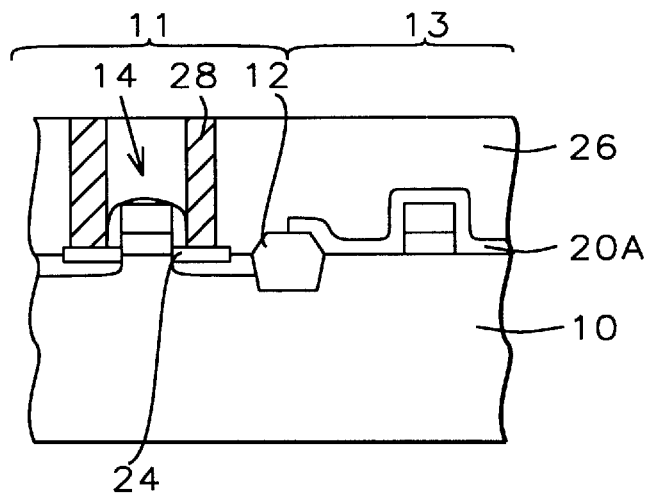

In the preferred embodiment, as shown in FIG. 6, the semiconductor device manufacturing continues in a conventional method. After forming the silicide regions (24), an interlevel dielectric layer (26) is formed over the silicide regions (24), the shallow trench isolation (12) and the gate (14). The interlevel dielectric layer (26) is patterned using conventional photolithography and etching processes to form a contact opening over the source and/or drain regions (16). A contact (28) is formed in the contact opening.

The corner recess (42) in the shallow trench isolation (12) is significantly reduced in a device fabricated in accordance with the present invention as shown in FIG. 6 as compared to a device fabricated using a conventional process as shown in FIG. 1.

While the invention has been particularly shown and described with reference to the preferred embodiments thereof, it will be understood by those skilled in the art that various changes in form and details may be made without departing from the spirit and scope of the invention.

What is claimed is:

1. A method for forming a gate which provides a reduced recess in an adjacent shallow trench isolation comprising the step of:

a. forming a shallow trench isolation on a semiconductor substrate; said semiconductor substrate having a cell area and an I/O area; said cell area be separated from said I/O area by said shallow trench isolation;

b. forming a gate on ad cell area of said semiconductor substrate;

c. implanting impurity ions adjacent to said gate to form source and drain regions;

d. depositing a resist protect oxide layer over said semiconductor substrate, said gate, and said shallow trench isolation; wherein said resist protect oxide layer is deposited using TEOS-O$_3$ having a ratio of TEOS/O$_3$ of between about 4 and 6, at a temperature of between about 350° C. and 400° C., and at a pressure of between about 50 torr and 70 torr; whereby said resist protect oxide layer has a greater porosity than said shallow trench isolation;

e. patterning said resist protect oxide layer to form a resist protect oxide mask; thereby exposing said cell area and a portion of said trench isolation; said resist protect oxide layer being etched selectively to said shallow trench isolation; and f. forming silicide regions on said source and drain regions.

2. The method of claim 1 wherein said resist protect oxide layer is patterned using a buffered oxide etch.

3. The method of claim 1 wherein said resist protect oxide has a thickness of between about 100 Angstroms and 400 Angstroms.

4. The method of claim 1 wherein said shallow trench isolation is formed using a HDPCVD process and said resist protect oxide has an etch selectivity to said shallow trench isolation of between about 8 and 10.

5. The method of claim 1 wherein said shallow trench isolation is formed using a high temperature annealed O3-TEOS process and said resist protect oxide has an etch selectivity to said shallow trench isolation of between about 8 and 10.

6. The method of claim 1 wherein said source and drain regions are formed by implanting B ion at an energy of between about 4.5 KeV and 5.5 Ker and at a dose of between about 3E85 atm/cm$^2$ and 4E15 atm/cm$^2$.

7. The method of claim 1 wherein said source and drain regions are formed by implanting As ions at an energy of between about 35 KeV and 45 KeV and at a dose of between about 5E15 atm/cm$^2$ and 6E15 atm/cm$^2$.

8. The method of claim 1 which further includes, after forming said silicide regions, forming an interlevel dielectric layer over said silicide regions and said gate; patterning said interlevel dielectric layer to form a contact opening over said source or drain regions; and forming a contact in said contact opening.

9. A method for forming a gate which provides a reduced recess in an adjacent shallow trench isolation, the steps of:
   a. forming a shallow trench isolation on a semiconductor substrate; said semiconductor substrate having a cell area and an I/O area; said cell area being separated from said I/O area by said shallow trench isolation; said shallow trench isolation being formed using a HDPCVD process;
   b. forming a gate on said cell area of said semiconductor substrate;
   c. implant impurity ions adjacent to said gate to form source and drain regions;
   d. depositing a resist protect oxide layer over said semiconductor substrate, said gate, and said shallow trench isolation using TEOS-$O_3$. having a ratio of TEOS/$O_3$ of between about 5 and 6, at a temperature of between about 350° C. and 400° C., and at a pressure of between about 50 torr and 70 torr; said resist protect oxide layer having a greater porosity than said shallow trench isolation;
   e. patterning said resist protect oxide layer to for a resist protect oxide mask using a buffered oxide etch; thereby exposing said source and drain regions and a portion of said shallow trench isolation; said resist protect oxide layer being selectively to said shallow trench isolation; said resist protect oxide having an etch selectively to sad shallow trench isolation of between about 8 and 10; and
   f. forming silicide regions on said source and drain regions.

10. The method of claim 9 wherein said resist protect oxide has a thickness of between about 100 Angstroms and 400 Angstroms.

11. A method for forming a gate which provides a reduced recess in an adjacent shallow trench insolation, comprising the steps of:
   a. forming a shallow trench isolation on a semiconductor substrate; said semiconductor substrate having a cell area and an I/O area; said cell area being separated from said I/O area by said shallow trench isolation; said shallow trench isolation being formed using a high temperature annealed $O_3$-TEOS process;
   b. forming a gate on said cell area of said semiconductor substrate;
   c. implanting impurity ions adjacent to said gate to form source and drain regions;
   d. depositing a resist protect oxide layer over said semiconductor substrate, said gate, and said shallow trench isolation using TEOS-$O_3$ having a ratio of TEOS/$O_3$ of between about 5 and 6, at a temperature of between about 350° C. and 400° C., and at a pressure of between about 50 torr and 70 torr; said resist protect oxide layer having a greater porosity than said shallow trench isolation;
   e. patterning said resist protect oxide layer to form a resist protect oxide mask using a buffered oxide etch; thereby exposing said source and drain regions and a portion of said shallow trench isolation; said resist protect oxide layer being etched selectively to said shallow trench isolation; said resist protect oxide having an etch selectivity to said shallow trench isolation of between about 8 and 10; and
   f. forming silicide regions on said source and drain regions.

* * * * *